United States Patent
Liang et al.

(10) Patent No.: US 7,209,347 B2
(45) Date of Patent: Apr. 24, 2007

(54) BLADE SERVER SYSTEM

(75) Inventors: Yuan-Chen Liang, Tao Yuan Shien (TW); Cheng-Wang Lin, Panchiao (TW); Chun-Yi Lien, Panchiao (TW); Chao-Jung Chen, Taipei (TW)

(73) Assignee: Quanta Computer Inc., Taoyuan Shien (TW)

( * ) Notice: Subject to any disclaimer, the term of this patent is extended or adjusted under 35 U.S.C. 154(b) by 113 days.

(21) Appl. No.: 11/105,517

(22) Filed: Apr. 14, 2005

(65) Prior Publication Data

US 2006/0007651 A1    Jan. 12, 2006

(30) Foreign Application Priority Data

Jul. 9, 2004    (TW) .............................. 93120625 A

(51) Int. Cl.
*G06F 1/16*    (2006.01)
*H05K 5/00*    (2006.01)
*H05K 7/00*    (2006.01)

(52) U.S. Cl. ........................ 361/686; 361/683; 361/752
(58) Field of Classification Search ................ 361/683, 361/686, 737, 756
See application file for complete search history.

(56) References Cited

U.S. PATENT DOCUMENTS

| 6,556,438 B1 * | 4/2003 | Bolognia et al. ............ 361/687 |
| 6,741,474 B1 * | 5/2004 | Hung et al. .................. 361/727 |

* cited by examiner

*Primary Examiner*—Tuan Dinh
*Assistant Examiner*—Hung S. Bui
(74) *Attorney, Agent, or Firm*—Rabin & Berdo, PC

(57) ABSTRACT

A blade server system including a housing, a middle plane board, a server blade and a display panel is provided. The server blade is electrically connected to the middle plane board, while the display panel is electrically connected to the middle plane board and is slideably disposed on the housing for displaying the operation status of the server blade.

13 Claims, 3 Drawing Sheets

BLADE SERVER SYSTEM

This application claims the benefit of Taiwan application Serial No. 93120625, filed Jul. 9, 2004, the subject matter of which is incorporated herein by reference.

BACKGROUND OF THE INVENTION

1. Field of the Invention

The invention relates in general to a blade server system, and more particularly to a blade server system capable of displaying the operating status of the server blades or the Motherboard (M/B) modules connected to the middle plane.

2. Description of the Related Art

Referring to FIG. 1, a schematic diagram illustrating a conventional blade server system uses a display screen for monitoring and testing is shown. A conventional blade server system 100 is disposed in a rack 110. A display screen 120 is further disposed in the rack 110 to show the operation status of each server blade 102 of the blade server system 100. Normally, a transmission line 122 extends from the display screen 120 to a connector at the rear of each server blade 102 (not shown in the diagram) to monitor the operation status of the server blade 102 and the efficiency of data processing thereof.

However, to install a high-efficiency display screen 120 in the rack 110 not only occupies a large space and increases rental payment, but also causes inconveniencies. That is, when examining the operation status of the server blades 102, the transmission line 122 must be connected to the server blades 102 one by one, so that the malfunctioned server blade 102 cannot be immediately identified when the display screen 120 is beeping, reducing the efficiency of system examination.

SUMMARY OF THE INVENTION

It is therefore an object of the invention to provide a blade server system, which can selectively inspect the operation status of the server blades and the M/B modules whenever necessary by using a display panel, not only reducing manufacturing costs but also improving the efficiency of system inspection.

The invention achieves the above-identified object by providing a blade server system, including a middle plane board, a server blade and a display panel. The server blade is electrically connected to the middle plane board. The display panel is electrically connected to the middle plane board for displaying the operation status of the server blade. The blade server system includes a fiber module electrically connected to the middle plane board for transmitting data processed by the server blade, while the display panel further displays the operation status of the fiber module and the efficiency of data transmission. The blade server system includes a switch server electrically connected to the middle plane board for performing RJ45 network signal transmission, while the display panel further displays the operation status of the switch server and the efficiency of data transmission. The blade server system includes a power module and a fan electrically connected to the middle plane board, while the display panel further displays the operation status of the power module and the fan.

The display panel displays the operation status of the server blade, the efficiency of data processing and the progress of program execution. The blade server system further includes another server blade, while the display panel can switch to display the operation status of the two server blades. The display panel is disposed on the front side of the blade server system. The blade server system includes a supporting frame connected to a housing edge on the front side of the blade server system for supporting the display panel. The supporting frame can rotate outwardly along the housing edge for the server blade to be inserted into or removed from the blade server system conveniently. The supporting frame rotates inwardly along the housing edge to a position parallel to the front side of the blade server system then halts and stops rotating inwardly.

The display panel can slide up and down in the supporting frame for the user to view the display panel conveniently. The display panel includes an adjusting button, wherein the user presses the adjusting button so as to slide the display panel up and down in the supporting frame. The display panel includes a number of buttons for the user to perform basic operations of entering the menu, switching the display items, selecting the display items and exiting the menu. Therefore, with the design of the display panel, the operation status of the server blades and the M/B modules can be inspected whenever necessary, improving inspection efficiency and reducing manufacturing costs.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
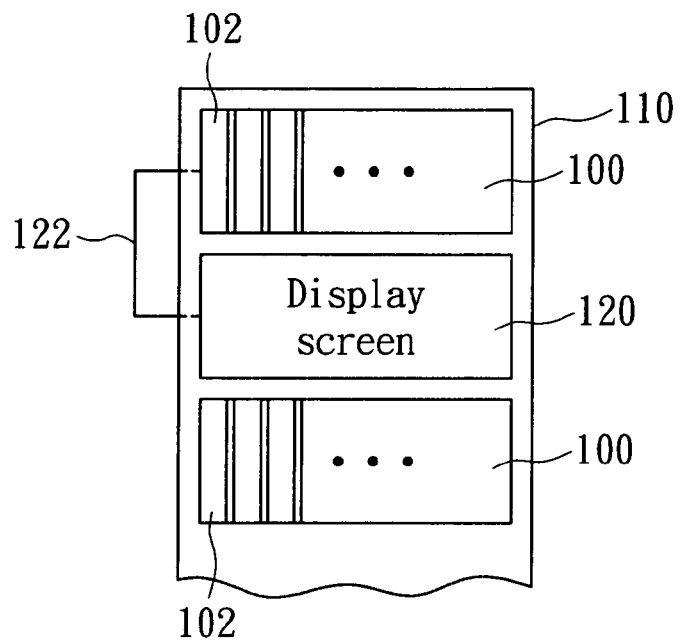
FIG. 1 is a schematic diagram illustrating a conventional blade server system uses a display screen for testing.
Figure 2:
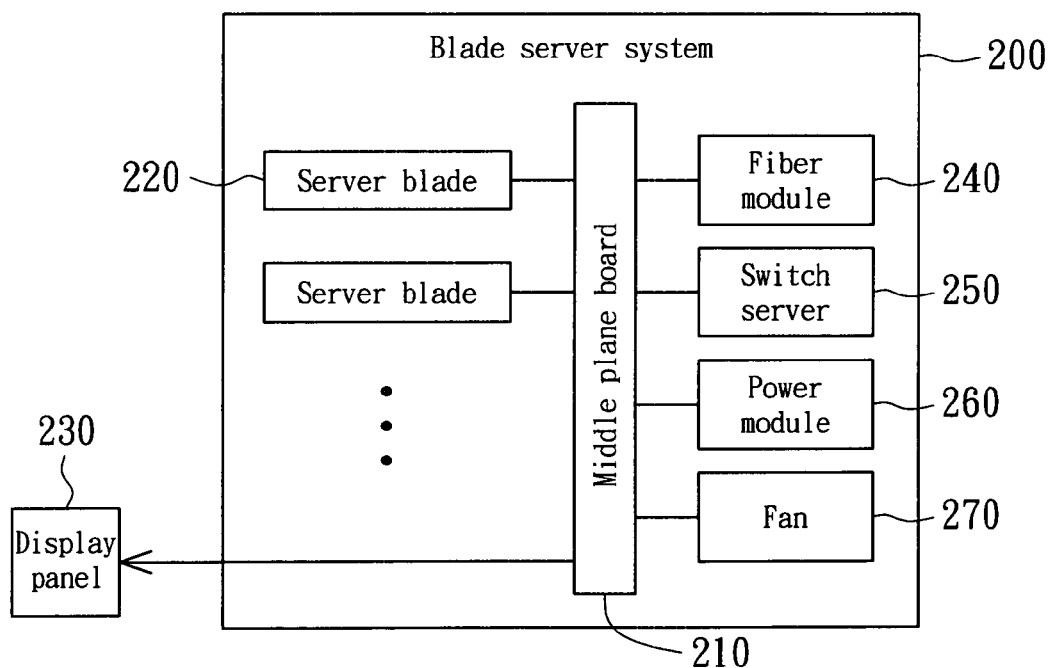
FIG. 2 is a structural diagram of a blade server system according to a preferred embodiment of the invention.

Referring to FIG. 2, a structural diagram of a blade server system according to a preferred embodiment of the invention is shown. The blade server system 200 includes a middle plane board 210, server blades 220, a display panel 230, a fiber module 240, a switch server 250, a power module 260 and a fan 270, wherein all of the server blade 220, the display panel 230, the fiber module 240, the switch blade 250, the power module 260 and the fan 270 are electrically connected to the middle plane board 210. The fiber module 240 transmits the data processed by the server blade 220, while the switch server 250 performs RJ45 network signal transmission. The display panel 230 can display the operation status of the fiber module 240 and the switch server 250 and the efficiency of data transmission as well as the power supply status of the power module 260 and the operation status of the fan 270. Besides, the display panel 230 can also display the operation status of each server blade 220, the efficiency of data processing and the progress of program execution. Meanwhile, the display panel 230 can switch to display the operation status of various server blades 220.

Figure 3A:
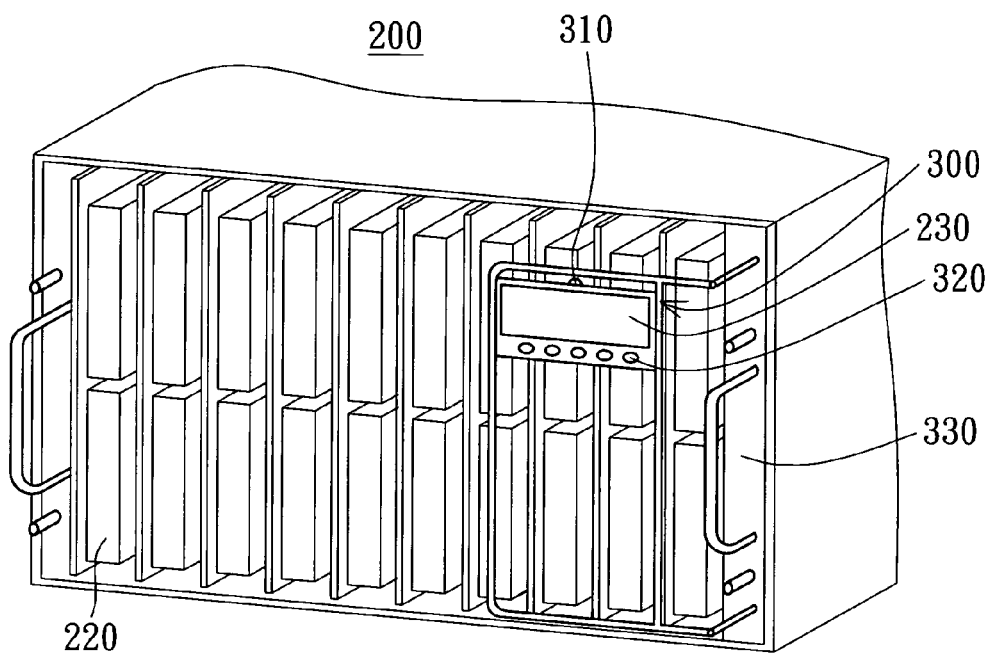
FIG. 3A is a three-dimensional structural diagram illustrating a display panel disposed on the blade server system in FIG. 2.
Figure 3B:
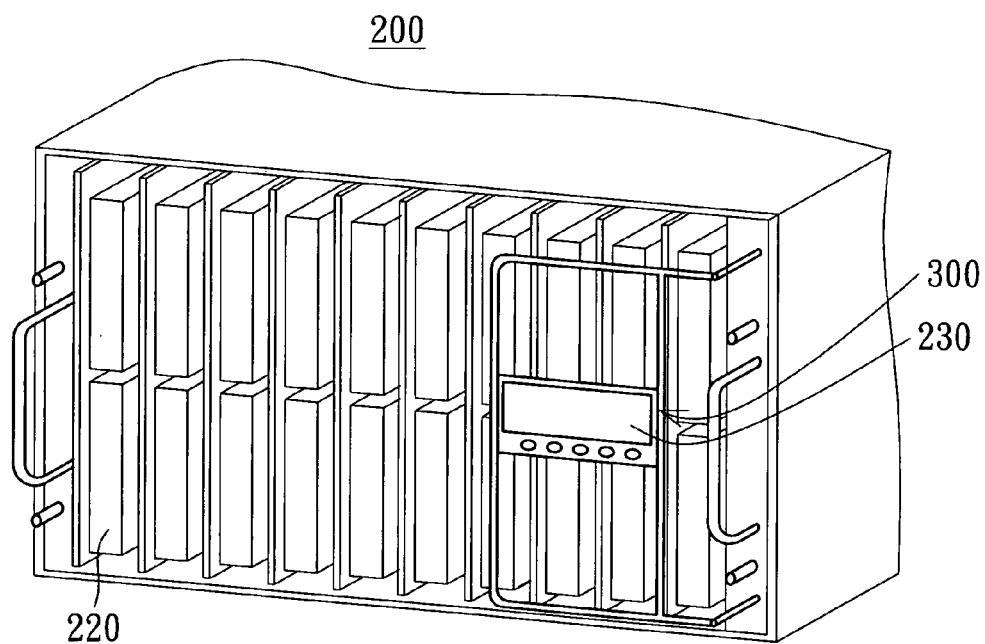
FIG. 3B is a three-dimensional structural diagram illustrating the display panel in FIG. 3A sliding to the middle part of a supporting frame.
Figure 3C:
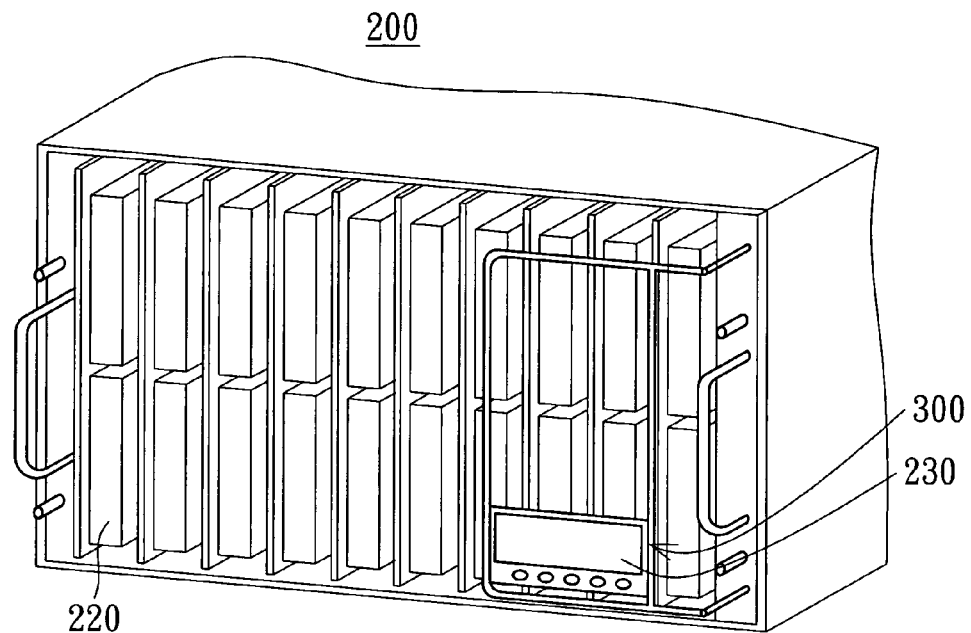
FIG. 3C is a three-dimensional structural diagram illustrating the display panel in FIG. 3A sliding to a lower part of a supporting frame.

Referring to FIG. 3A, a three-dimensional structural diagram illustrating a display panel disposed on the blade server system in FIG. 2 is shown. The display panel 230 is disposed on the front side of the blade server system 200 for the user to view conveniently. The blade server system 200 includes a supporting frame 300 connected to a housing edge 330 on the front side of the blade server system for supporting the display panel 230. The display panel 230 can slide up and down along a sliding track in the supporting frame 300. As shown in FIG. 3A to FIG. 3C, the display panel 230 is respectively positioned at different positions, including the first position—the upper part (shown in FIG. 3A), the second position—the middle part (shown in FIG. 3B) and the third position—the lower part (shown in FIG. 3C) of the supporting frame 300. The position of the display panel 230 on the supporting frame 300 can be adjusted according to the height of the blade server system 200 disposed in the rack so that the user can view the display panel 230 more conveniently. As shown in FIG. 3A, the upper part of the display panel 230 includes an adjusting button 310, while the user presses the adjusting button 310 allowing the display panel 230 to slide up and down in the supporting frame 300.

Figure 3D:
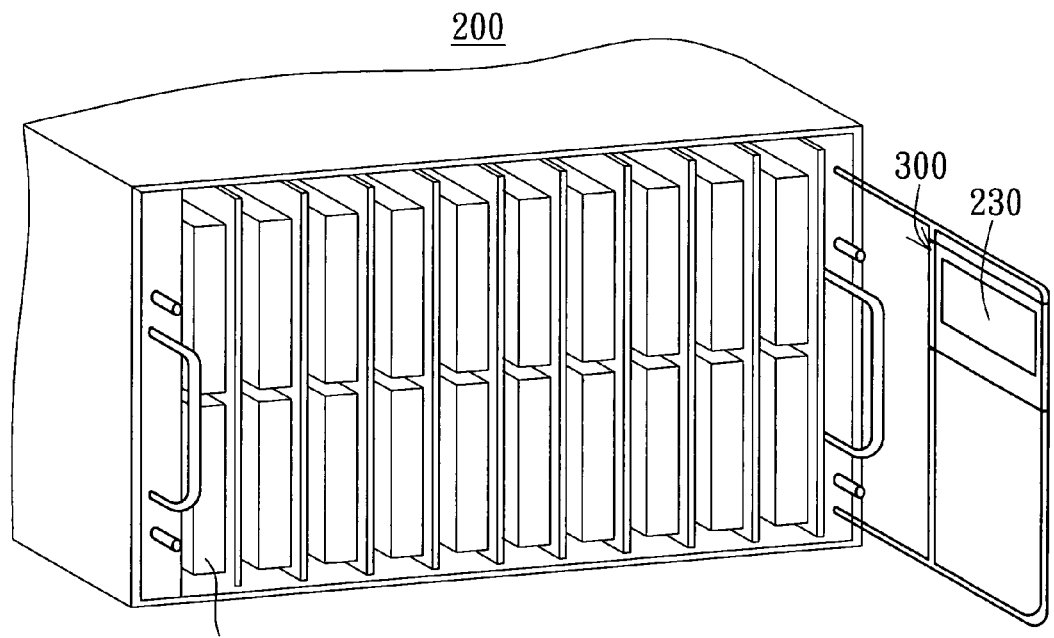
FIG. 3D is a three-dimensional structural diagram illustrating the supporting frame in FIG. 3A rotating outwardly to a position perpendicular to the front side of a blade server system.

Besides, the supporting frame 300 can rotate along the housing edge 330 using the housing edge 330 as an axis. As shown in FIG. 3D, when the supporting frame 300 rotates outwardly to a fourth position perpendicular to the front side of the blade server system 200, so that the server blade 220 can be inserted into or removed from the blade server system 200 conveniently. Moreover, when the supporting frame 300 rotates inwardly along the housing edge 330 to be parallel to the front side of the blade server system 200, the supporting frame 300 can be fixed by a wedge to prevent rotating inwardly to collide with the server blades 220. Meanwhile, as shown in FIG. 3A, the display panel 230 is exactly parallel to the front side of the blade server system 200, which is very convenient for the user to view.

As shown in FIG. 3A, the display panel 230 further includes a number of buttons 320 for the user to perform basic operations of entering the menu, switching the display items, selecting the display items and exiting the menu. The display items include the server blades 220, the fiber module 240, the switch server 250, the power module 260 and the fan 270 disclosed above.

According to the above preferred embodiment, the blade server system of the invention has the advantages of using a simple design of the display panel to display operation status and efficiency of each server blade and examine the operation status of the M/B modules and the efficiency of data transmission, unlike the system according to prior art whose malfunctioned server blades or M/B modules are very hard to identify when the system beeps to send a warning message. Furthermore, the display panel can slide up and down in the supporting frame for the user to view conveniently without a display screen of prior art, not only improving inspection efficiency but also reducing manufacturing costs.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A blade server system, comprising:
   a housing;
   a middle plane board, disposed in the housing;
   a server blade, electrically connected to the middle plane board; and
   a display panel, electrically connected to the middle plane board and slideably disposed on the housing for displaying the operation status of the server blade, the display panel being slideable in an up and down direction.

2. The blade server system according to claim 1, wherein the blade server system comprises a fiber module electrically connected to the middle plane board for transmitting the data processed by the server blade, while the display panel further displays the operation status of the fiber module and the efficiency of data transmission.

3. The blade server system according to claim 1, wherein the blade server system comprises a switch server electrically connected to the middle plane board for performing RJ45 network signal transmission, while the display panel further displays the operation status of the switch server and the efficiency of data transmission.

4. The blade server system according to claim 1, wherein the blade server system comprises a power module and a fan electrically connected to the middle plane board, while the display panel further displays the operation status of the power module and the fan.

5. The blade server system according to claim 1, wherein the blade server system further comprises a second server blade, while the display panel can switch to display the operation status of the server blade and the second server blade.

6. The blade server system according to claim 1, wherein the display panel is disposed on the front side of the housing.

7. The blade server system according to claim 6, wherein the blade server system further comprises a supporting frame connected to a housing edge on the front side of the housing for supporting the display panel.

8. The blade server system according to claim 7, wherein the supporting frame can rotate outwardly along the housing edge to a position perpendicular to the front side of the housing for the server blade to be inserted into or removed from the blade server system conveniently.

9. The blade server system according to claim 8, wherein the supporting frame can rotate inwardly along the housing edge to a position parallel to the front side of the blade server system then halts and stops rotating inwardly.

10. The blade server system according to claim 7, wherein the display panel can slide up and down in the supporting frame for a user to view the display panel conveniently.

11. The blade server system according to claim 10, wherein the display panel comprises an adjusting button, while the user presses the adjusting button so as to slide the display panel up and down in the supporting frame.

12. The blade server system according to claim 1, wherein the display panel comprises a plurality of buttons for the user to perform basic operations of entering the menu, switching the display items, selecting the display items and exiting the menu.

13. A blade server system, comprising:
   a housing having a front side;
   a middle plane board, disposed in the housing;

a server blade, electrically connected to the middle plane board; and a display panel, electrically connected to the middle plane board and being parallel to, and slideably disposed in, a plane that is parallel to the front side of the housing for displaying the operation status of the server blade.

* * * * *